United States Patent
Tsai

(10) Patent No.: US 7,268,086 B2
(45) Date of Patent: Sep. 11, 2007

(54) METHOD FOR REDUCING CRITICAL DIMENSION AND SEMICONDUCTOR ETCHING METHOD

(75) Inventor: Chang-Hu Tsai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/161,996

(22) Filed: Aug. 25, 2005

(65) Prior Publication Data

US 2007/0051696 A1 Mar. 8, 2007

(51) Int. Cl.
*H01L 21/302* (2006.01)

(52) U.S. Cl. .................. 438/714; 438/706; 438/710; 216/58

(58) Field of Classification Search ........... 438/706, 438/710, 712, 714; 216/58
See application file for complete search history.

(56) References Cited

U.S. PATENT DOCUMENTS 6,106,659 A * 8/2000 Spence et al. ......... 156/345.43
6,372,651 B1 * 4/2002 Yang et al. ................ 438/706
7,091,104 B2 * 8/2006 Kim et al. ................. 438/424
2001/0017286 A1 * 8/2001 Zanotti ......................... 216/13

* cited by examiner

*Primary Examiner*—Lan Vinh
(74) *Attorney, Agent, or Firm*—Jianq Chyun IP Office

(57) ABSTRACT

A method of reducing critical dimension is provided. A dielectric layer is formed on a substrate. Then, a patterned photoresist is formed on the dielectric layer to expose part of the dielectric layer, wherein the patterned photoresist has a first line width. An etching process is performed to remove the exposed dielectric layer by using the patterned photoresist as an etching mask, wherein the final line width of the dielectric layer is smaller than the first line width. The conditions of the etching process include an etching pressure at 80 torr to 400 torr, an etching gas that includes a fluorocarbon compound and oxygen, wherein the ratio of the fluorocarbon compound to the oxygen is large than 0 and less than 10. Consequently, the etching process can be stabilized to form a smooth sidewall for the gate and to provide a uniform critical dimension.

14 Claims, 2 Drawing Sheets

METHOD FOR REDUCING CRITICAL DIMENSION AND SEMICONDUCTOR ETCHING METHOD

BACKGROUND OF THE INVENTION

1. Field of the Invention

The present invention relates to semiconductor process. More particularly, the present invention relates to a method for reducing the critical dimension (CD) and a semiconductor etching method.

2. Description of Related Art

The metal-oxide semiconductor (MOS) transistor is an essential electronic element in the integrated circuits. Thus, the electrical performance of a MOS transistor will affect the quality of the product. A general approach in raising the electrical performance of a MOS transistor is to reduce the smallest linewidth of the gate to increase the operation speed of the gate. Normally, during the fabrication of the gate, a hard mask layer is first formed on the polysilicon layer. Further using a patterned photoresist layer above the hard mask layer as an etching mask, an etching process is performed on the hard mask layer. The hard mask layer is then used as a mask for etching the polysilicon layer to form the gate. However, confined by the yellow light process, this approach can not be used for further miniaturization of devices to attain the smallest line width for the gate. A present, a method that is not limited by the yellow light process is developed to reduce the critical dimension. FIGS. 1A to 1C are schematic cross-sectional views illustrating a process flow of reducing the critical dimension of a MOS transistor gate, according to the prior art. As shown in FIG. 1A, a substrate 100 is provided. A hard mask layer 102 is formed on the substrate 100. A patterned photoresist layer 104 is further formed on the hard mask layer 102, wherein this patterned photoresist layer 104 has a first line width L1.

Referring to FIG. 1B, the photoresist layer is trimmed, curtailing the photoresist layer 104 to a downsized patterned photoresist layer 104 having a line width L2.

Referring to FIG. 1C, a low etching-rate etching process is performed to remove the hard mask layer 102 not covered by the downsized patterned photoresist layer 104' to form the patterned hard mask layer 102'. The preliminary manufacturing process of a MOS transistor gate is thereby completed.

However, the photoresist trimming process is not stable. When the etching is too fast, the remaining thickness of the photoresist layer may become insufficient, generating the necking or widening phenomenon. Further, the photoresist layer may not be uniform, causing the gate to have a rough sidewall or twisty line. Ultimately, the shape of the gate and the uniformity of the critical dimension are adversely affected.

SUMMARY OF THE INVENTION

At least on object of the present invention is to provide a method for reducing the critical dimension, wherein the photoresist trimming process can be eliminated to raise the stability of the process to provide a uniform critical dimension.

The present invention also provides a semiconductor etching method, wherein the etching and the photoresist trimming can be conducted concurrently to raise the stability of the etching process.

To achieve these and other advantages and in accordance with the purpose of the invention, as embodied and broadly described herein, the invention provides a method for reducing the critical dimension. The method includes forming a dielectric layer on a substrate. A patterned photoresist layer is then formed on the dielectric layer, wherein the patterned photoresist layer exposes a portion of the dielectric layer. The patterned photoresist layer includes a first line width. Using the patterned photoresist layer as an etching mask, an etching process is performed to remove the exposed dielectric layer and to form the dielectric layer with the ultimate line width smaller than the first line width. The etching process includes conducting under a pressure of about 80 to 400 torr and using a reacting gas that comprises a fluorocarbon compound (CF compound, $CH_xF_y$) and oxygen, wherein the ratio of the flow rate of the fluorocarbon compound to the flow rate of oxygen is greater than 0 but is less than 10.

According to one embodiment of the present invention for reducing the critical dimension, the flow rate of the fluorocarbon compound to the flow rate of oxygen is, for example, between 4 to 8.

According to one embodiment of the present invention for a reducing the critical dimension, the etching process further includes controlling the flow rate of the fluorocarbon compound to the flow rate of oxygen to control the dimension of the final line width of the dielectric layer.

In accordance to one embodiment of the present invention for reducing the critical dimension, the fluorocarbon compound includes, but not limited to, difluoromethane ($CH_2F_2$), trifluoromethane ($CHF_3$), a mixture of trifluoromethane and tetrafluoromethane, a mixture of difluoromethane and tetrafluoromethane or a mixture of difluoromethane and trifluoromethane.

In accordance to one embodiment of one embodiment of the present invention for reducing the critical dimension, the process conditions for the etching process further includes a source power, for example, less than 200 W, a bottom power, for example, greater than 250 W and a temperature of about −50° C. to 50° C.

According to one embodiment of the present invention for reducing the critical dimension, the etching process employs a gas that includes an inert gas, wherein the flow rate of the inert gas is greater than 200 sccm.

According to one embodiment of the present invention for reducing the critical dimension, a material of the dielectric layer includes silicon oxide, silicon nitride or silicon oxynitride.

According to a semiconductor etching method of the present invention, under a pressure of 80 to 400 torr and a specific temperature, an etching mixture gas and an inert gas are delivered into the etching chamber. A source power and a bottom power are also applied to the etching chamber to perform an etching on the dielectric layer not covered by the patterned photoresist layer. The etching mixture gas includes a fluorocarbon compound and an oxygen gas with the flow rate of the fluorocarbon compound to the flow rate of oxygen greater than 0 and less than 10 in order to remove the exposed dielectric layer and to trim the patterned photoresist layer concurrently.

In accordance to one embodiment of the semiconductor etching method of the present invention, the flow rate of the fluorocarbon compound to the flow rate of oxygen is between 4 to 8.

According to one embodiment of the semiconductor etching method of the present invention, the etching process further includes controlling the flow rate of the fluorocarbon compound to the flow rate of oxygen to control the critical dimension of the dielectric layer.

In accordance to one embodiment of the semiconductor etching method of the present invention, the fluorocarbon compound includes, but not limited to, difluoromethane ($CH_2F_2$), trifluoromethane ($CHF_3$), a mixture of trifluoromethane and tetrafluoromethane, a mixture of difluoromethane and tetrafluoromethane, or a mixture of difluoromethane and trifluoromethane.

According to one embodiment of the semiconductor etching method of the present invention, the source power is less than 200 W, for example, the bottom power is greater than 250 W, and the temperature is between −50° C. to 50° C.

According to one embodiment of the semiconductor etching method of the present invention, the flow rate of the inert gas is greater than 200 sccm, for example.

According to one embodiment of the semiconductor etching method of the present invention, the material for the dielectric layer includes silicon oxide, silicon nitride or silicon oxynitride.

In accordance to the present invention, an etching pressure higher than the prior art and a reacting gas for etching the photoresist that is not normally used in the prior art are used. That means, by controlling the ratio of the fluorocarbon compound and the oxygen gas in the etching mixture gas, the size of the critical dimension of the dielectric layer can be accurately controlled.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
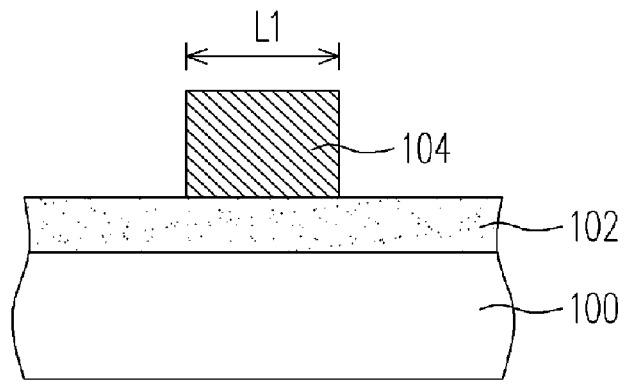
FIGS. 1A to 1C are schematic cross-sectional views showing the steps of a method for reducing the critical dimension of a MOS transistor gate, according to the prior art.
Figure 1B:
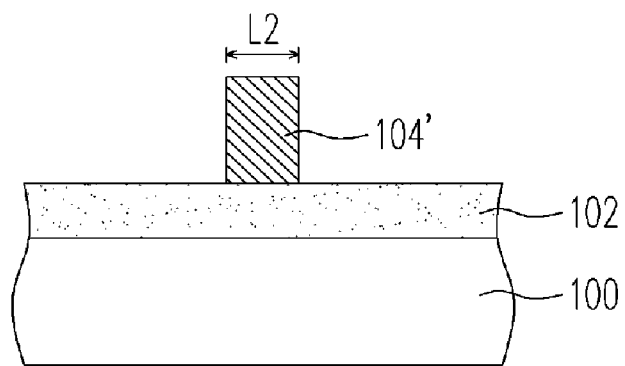
Figure 1C:
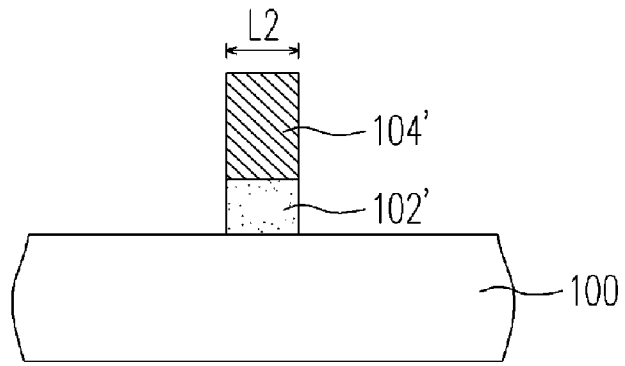
Figure 2A:
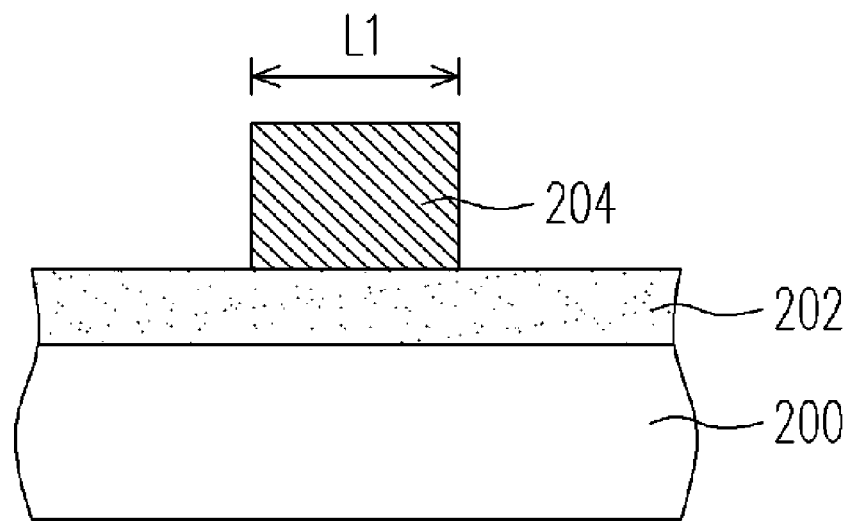
FIGS. 2A through 2B are schematic cross-sectional views showing the steps of a method for reducing the critical dimension according to one embodiment of the present invention.
Figure 2B:
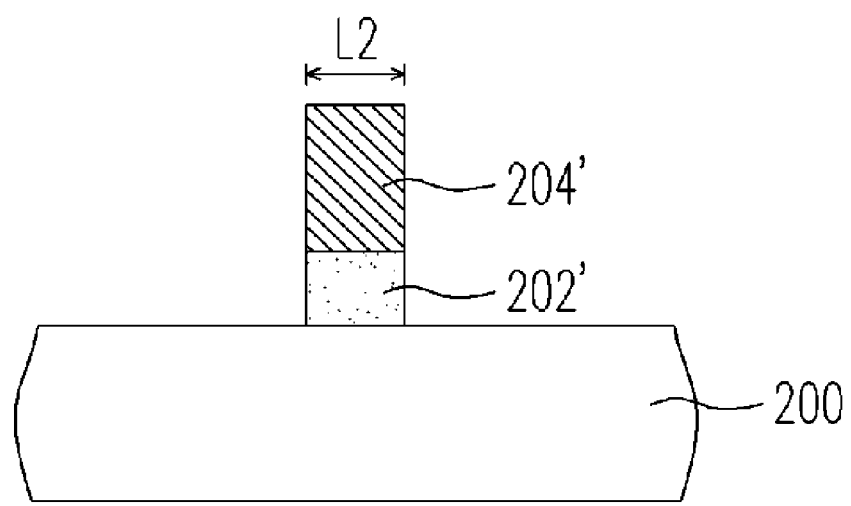

FIGS. 2A through 2B are schematic cross-sectional views showing the steps of a method for reducing the critical dimension according to one embodiment of the present invention. According to FIG. 2A, a dielectric layer 202 is formed on a substrate 200, wherein the material of the dielectric layer includes, but not limited to, silicon oxide, silicon nitride or silicon oxynitride. A patterned photoresist layer 204 is formed on the dielectric layer 202, wherein the patterned photoresist layer 204 exposes a part of the dielectric layer 202. The patterned photoresist layer 204 further includes a first line width L1.

Referring to FIG. 2B, using a patterned photoresist layer 204 as an etching mask, an etching is performed under a pressure of about 80 to 400 torrs and at a temperature between −50° C. to 50° C. The exposed dielectric layer 202 is removed, and a downsized patterned photoresist layer 204' and a patterned dielectric layer 202' with a final line width L2 less than the first line width L1 are resulted. In the above etching process, a reacting gas including a fluorocarbon compound and an oxygen gas is used, wherein the ratio of the flow rate of the fluorocarbon compound to the flow rate of the oxygen gas is greater than 0 and is less than 10, and is preferably between 4 to 8, for example. Moreover, the ratio of the flow rate of the fluorocarbon compound to the flow rate of the oxygen gas is controlled in order to control the final line width of the dielectric layer. In one embodiment of the present invention, the fluorocarbon compound of the present invention includes, but not limited to, difluoromethane ($CH_2F_2$), trifluoromethane ($CHF_3$), a mixture of trifluoromethane and tetrafluoromethane, a mixture of difluoromethane and trifluoromethane or a mixture of difluoromethane and tetrafluoromethane. The gas used in the etching process may further include an inert gas with a flow rate greater than 200 sccm. Further, the source power applied to the etching process is lower than 200 W while the bottom power is greater than 250 W.

In another embodiment of the present invention, a semiconductor etching process is provided. The etching is performed on a dielectric layer disposed under a patterned photoresist layer. The etching is conducted under a pressure of 80 to 400 torr and at a temperature of about −50° C. to 50° C., with an etching mixture gas and an inert gas delivered to the etching chamber and a source power and a bottom power applied to the etching chamber. The source power is less than 200 W, while the bottom power is greater than 250 W. A material for the dielectric layer is, for example, silicon oxide, silicon nitride or silicon oxynitride. The flow rate of the inert gas is greater than 200 sccm, for example. Further, the above mentioned etching mixture gas includes a fluorocarbon compound and an oxygen gas. The ratio of the flow rate of the fluorocarbon compound to the flow rate of the oxygen gas is greater than 0 and is less than 10, and is preferably between 4 to 8 to concurrently trimming the patterned photoresist layer and removing the exposed dielectric layer. In one embodiment of the invention, the fluorocarbon compound includes, but not limited to, difluoromethane ($CH_2F_2$), trifluoromethane ($CHF_3$), a mixture of trifluoromethane and tetrafluoromethane, a mixture of difluoromethane and trifluoromethane or a mixture of difluoromethane and tetrafluoromethane.

The etching process of the present invention is also applicable in other semiconductor processes. Examples of such are discussed below.

In the fabrication of a gate, a hard mask layer is normally used as an etching mask for the polysilicon gate. The dielectric layer in the present invention is equivalent to the hard mask layer in the gate fabrication process. Therefore, with the etching process of the present invention, the line width of the hard mask layer is first reduced in order to reduce the critical dimension of the gate.

In the fabrication process of a shallow trench isolation structure, a silicon nitride layer is normally used as an etching mask to perform the etching on the silicon substrate to form a trench therein. The dielectric layer of the present invention is equivalent to the above-mentioned silicon nitride layer. Therefore, with the etching process of the present invention, the silicon nitride layer can be defined with a reduced critical dimension.

In the fabrication process for a shallow trench isolation structure, wherein this process is similar to the above fabrication process of a shallow trench isolation structure. The only difference is that the hard mask layer is first served as the etching mask for the above-mentioned silicon nitride layer to perform the etching on the silicon nitride layer. The etched silicon nitride layer is then used as a mask to perform the etching of the substrate to form the trench therein. The dielectric layer disclosed in the present invention is equivalent to the above-mentioned hard mask layer in this shallow trench isolation fabrication process.

In accordance to the above embodiments, an etching pressure high than that in prior art and a reacting gas that has is not used conventionally in the etching of a photoresist are used in the present invention to eliminate a step directed only to the trimming of the photoresist. The manufacturing process is thus simplified, while the size of the critical dimension of the dielectric layer can be accurately controlled. Consequently, the critical dimension can be more uniform and the stability of the fabrication process is enhanced.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for reducing a critical dimension, the method comprising:
    forming a dielectric layer on a substrate;
    forming a patterned photoresist layer on the dielectric layer to expose a portion of the dielectric layer, wherein the patterned photoresist layer comprises a first line width; and
    performing an etching process to remove the exposed dielectric layer and to form the dielectric layer with a final line width which is smaller than the first line width, using the patterned photoresist layer as an etching mask, wherein the etching process is performed under conditions that include:
    a source power, which is applied on an etching chamber for performing the etching process, lower than 200 W when a bottom power applied on the etching chamber is greater than 250 W;
    a pressure between 80 to 400 torrs; and
    a gas comprising a fluorocarbon compound and an oxygen gas, wherein a ratio of a flow rate of the fluorocarbon compound to a flow rate of the oxygen gas is greater than 0 and less than 10.

2. The method of claim 1, wherein the ratio of the flow rate of the fluorocarbon compound to the flow rate of the oxygen gas is between 4 to 8.

3. The method of claim 1, wherein the etching process further comprises controlling the ratio of the flow rate of the fluorocarbon compound to the flow rate of the oxygen gas to control a size of the final line width.

4. The method of claim 1, wherein the etching process is performed using an inert gas with a flow rate greater than 200 sccm.

5. The method of claim 1, wherein the etching process is performed at a temperature between −50° C. to 50° C.

6. The method of claim 1, wherein the fluorocarbon compound is selected from the group consisting of difluoromethane (CH2F2), trifluoromethane (CHF3), a mixture of trifluoromethane and tetrafluoromethane, a mixture of difluoromethane and trifluoromethane or a mixture of difluoromethane and tetrafluoromethane.

7. The method of claim 1, wherein the dielectric layer comprises a material selected from the group consisting of silicon oxide, silicon nitride and silicon oxynitride.

8. A semiconductor etching method, applicable in etching a dielectric layer covered with a patterned photoresist layer thereover under a pressure and a temperature, the method comprising:
    applying a source power and a bottom power to an etching chamber, wherein the source power is lower than 200 W when the bottom power is greater than 250 W;
    adjusting the pressure to about 80 to 400 torr; and
    supplying an etching mixture gas that comprises a fluorocarbon compound and an oxygen gas and an inert gas to the etching chamber, wherein a ratio of a flow rate of the fluorocarbon compound to a flow rate of the oxygen gas is greater than 0 and is less than 10 so that the patterned photoresist layer is trimmed and the dielectric layer is concurrently removed.

9. The method of claim 8, wherein the ratio of the flow rate of the fluorocarbon compound to the flow rate of the oxygen gas is between 4 to 8.

10. The method of claim 8 further comprising controlling the ratio of the flow rate of the fluorocarbon compound to the flow rate of the oxygen gas to control a critical dimension of the dielectric layer.

11. The method of claim 8, wherein a flow rate of the inert gas is greater than 200 sccm.

12. The method of claim 8, wherein the temperature is between −50° C. to 50° C.

13. The method of claim 8, wherein the fluorocarbon compound is selected from the group consisting of difluoromethane (CH2F2), trifluoromethane (CHF3), a mixture of trifluoromethane and tetrafluoromethane, a mixture of difluoromethane and trifluoromethane or a mixture of difluoromethane and tetrafluoromethane.

14. The method of claim 8, wherein the dielectric layer comprises a material selected from the group consisting of silicon oxide, silicon nitride and silicon oxynitride.

* * * * *